(12) United States Patent
Okuno

(10) Patent No.: US 7,407,363 B2
(45) Date of Patent: Aug. 5, 2008

(54) SUBSTRATE TRANSPORT APPARATUS AND SUBSTRATE TRANSPORT METHOD

(75) Inventor: Eiji Okuno, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 323 days.

(21) Appl. No.: 11/391,767

(22) Filed: Mar. 24, 2006

(65) Prior Publication Data

US 2006/0245853 A1    Nov. 2, 2006

(30) Foreign Application Priority Data

Mar. 28, 2005    (JP)    ............................. 2005-092505

(51) Int. Cl.
*B65G 35/00*    (2006.01)
(52) U.S. Cl. ................. 414/806; 414/222.01; 414/749.1
(58) Field of Classification Search .............. 414/331.1, 414/331.11, 331.18, 749.1, 749.5, 751.1, 414/752.1, 800, 806, 935, 222.01, 222.07, 414/222.09, 222.112
See application file for complete search history.

(56) References Cited

U.S. PATENT DOCUMENTS

| | | | | |
|---|---|---|---|---|
| 5,564,889 A | * | 10/1996 | Araki | ........................ 414/806 |
| 6,722,834 B1 | * | 4/2004 | Tepman | ..................... 414/217 |
| 2002/0094265 A1 | * | 7/2002 | Momoki | .................. 414/744.5 |
| 2002/0150459 A1 | | 10/2002 | Fujii et al. | |

* cited by examiner

*Primary Examiner*—Donald Underwood
(74) *Attorney, Agent, or Firm*—Ostrolenk, Faber, Gerb & Soffen, LLP

(57) ABSTRACT

A substrate transport apparatus includes a first substrate transport robot, a second substrate transport robot and a substrate transfer mechanism. The first substrate transport robot includes an upper hand and a lower hand vertically arranged. The second substrate transport robot includes an upper hand and a lower hand vertically arranged. The substrate transfer mechanism includes an upper hand and a lower hand vertically arranged and a hand driving mechanism adapted to perform hand opening and closing operations to vertically move the upper and lower hands.

6 Claims, 8 Drawing Sheets

SUBSTRATE TRANSPORT APPARATUS AND SUBSTRATE TRANSPORT METHOD

BACKGROUND OF THE INVENTION

1. Field of the Invention

The present invention relates to a substrate transport apparatus and a substrate transport method. Exemplary substrates to be transported include semiconductor wafers, glass substrates for liquid crystal display devices, glass substrates for plasma display devices, substrates for optical disks, substrates for magnetic disks, substrates for magneto-optical disks, and substrates for photo masks.

2. Description of Related Art

Substrate treatment apparatuses of a single substrate treatment type for use in a semiconductor device production process typically include an indexer section and a treatment section. The treatment section includes a treatment unit for treating a substrate, and a main transport robot which loads and unloads the substrate with respect to the treatment unit (see, for example, U.S. Patent Application Publication No. US2002/0150459A1). The indexer section includes a carrier retaining portion for retaining a carrier which is capable of accommodating a plurality of substrates in a stacked state, and an indexer robot which transports a substrate between the carrier retained by the carrier retaining portion and the main transport robot.

An untreated substrate is taken out of the carrier and transferred to the main transport robot by the indexer robot, and loaded into the treatment unit by the main transport robot. A substrate treated by the treatment unit is unloaded from the treatment unit and transferred to the indexer robot by the main transport robot, and carried into the carrier by the indexer robot.

The main transport robot and the indexer robot are, for example, of a double arm type, each including an upper hand and a lower hand vertically arranged in a retractable manner and adapted to hold the treated substrate by the upper hand thereof and hold the untreated substrate by the lower hand thereof. That is, the main transport robot loads the untreated substrate into the treatment unit by the lower hand thereof immediately after unloading the treated substrate from the treatment unit by the upper hand thereof. Further, the main transport robot transfers the treated substrate from the upper hand thereof to the upper hand of the indexer robot, and receives another untreated substrate from the lower hand of the indexer robot by the lower hand thereof. The indexer robot transports the treated substrate to the carrier and carries the treated substrate into the carrier by the upper hand thereof, and takes out another untreated substrate from the carrier by the lower hand thereof.

The substrates are transferred between the main transport robot and the indexer robot in the following manner.

1. The indexer robot is moved to a position opposed to a substrate transfer position.
2. The indexer robot advances the lower hand thereof holding the untreated substrate to the substrate transfer position.
3. The main transport robot is moved to a position opposed to the substrate transfer position.
4. The main transport robot advances the lower hand thereof to the substrate transfer position, slightly moves up the lower hand thereof to take up the untreated substrate from the lower hand of the indexer robot, and then retracts the lower hand thereof.
5. The indexer robot retracts the lower hand thereof.
6. The indexer robot advances the upper hand thereof to the substrate transfer position.
7. The main transport robot advances the upper hand thereof holding the treated substrate to the substrate transfer position, slightly moves down the upper hand thereof to transfer the treated substrate to the upper hand of the indexer robot, and then retracts the upper hand thereof.
8. The indexer robot retracts the upper hand thereof.

With the aforesaid arrangement, the main transport robot requires time for the advancement and retraction of the upper and lower hands thereof and for the upward and downward movement of the upper and lower hands thereof for the transfer of the substrates between the main transport robot and the indexer robot. Further, the indexer robot requires time for the advancement and retraction of the upper and lower hands thereof.

Therefore, the main transport robot and the indexer robot are constrained for a longer period for the transfer of the substrates therebetween, thereby hindering the improvement of the substrate transport speed and the reduction of the substrate transport time.

SUMMARY OF THE INVENTION

It is an object of the present invention to provide a substrate transport apparatus and a substrate transport method, which reduce the time required for the transfer of a substrate between two substrate transport robots thereby to reduce the time required for the transportation of the substrate.

The inventive substrate transport apparatus comprises a first substrate transport robot including an upper hand and a lower hand vertically arranged and capable of transporting substrates respectively held by the upper hand and the lower hand thereof, a second substrate transport robot including an upper hand and a lower hand vertically arranged and capable of transporting substrates respectively held by the upper hand and the lower hand thereof, and a substrate transfer mechanism which is accessed by the first substrate transport robot and the second substrate transport robot to transfer the substrates with respect to the first substrate transport robot and the second substrate transport robot, the substrate transfer mechanism including an upper hand and a lower hand vertically arranged and a hand driving mechanism adapted to perform a hand opening operation to vertically move the upper hand and the lower hand of the substrate transfer mechanism apart from each other and perform a hand closing operation to vertically move the upper hand and the lower hand of the substrate transfer mechanism toward each other.

With this arrangement, the transfer of the substrates between the first and second substrate transport robots is achieved via the substrate transfer mechanism. The first and second substrate transport robots are of a plural-hand type, each including at least the upper and lower hands in pair. The substrate transfer mechanism also includes the upper and lower hands in pair.

The substrate transfer mechanism causes the hand driving mechanism to widen a gap between the upper hand and the lower hand thereof to perform the hand opening operation and to narrow the gap between the upper hand and the lower hand thereof to perform the hand closing operation.

Therefore, the hand opening operation is performed, for example, in such a state that the upper and lower hands of the substrate transfer mechanism kept closed with the gap therebetween narrowed are located between the upper hand and the lower hand of the first substrate transport robot, whereby a substrate can be taken up from the upper hand of the first substrate transport robot by the upper hand of the substrate transfer mechanism and, at the same time, a substrate can be placed on the lower hand of the first substrate transport robot by the lower hand of the substrate transfer mechanism.

Further, the hand closing operation is performed, for example, in such a state that the upper and lower hands of the second substrate transport robot are located between the upper hand and the lower hand of the substrate transfer mechanism kept opened with the gap therebetween widened, whereby a substrate on the upper hand of the substrate transfer mechanism can be placed on the upper hand of the second substrate transport robot and, at the same time, a substrate on the lower hand of the second substrate transport robot can be taken up by the lower hand of the substrate transfer mechanism.

Thus, the substrates can be exchanged between the substrate transfer mechanism and the first or second substrate transport robot by the hand opening operation or the hand closing operation of the substrate transfer mechanism. Therefore, the first and second substrate transport robots are each constrained for the transfer of the substrates only for a period which is equivalent to the time required for simultaneously advancing their upper and lower hands to an access position, awaiting completion of the hand opening operation or the hand closing operation performed by the substrate transfer mechanism and retracting their upper and lower hands from the access position. Thus, the time required for the transfer of the substrates is drastically reduced and, as a result, the substrate transport time can be reduced as compared with the prior art. In addition, the first and second substrate transport robots respectively perform substrate transfer operations with respect to the substrate transfer mechanism without the need for synchronization of the operations. This improves the substrate transport efficiency, thereby further reducing the substrate transport time.

The first substrate transport robot may be an indexer robot which takes out an untreated substrate from a substrate-accommodating carrier to transfer the untreated substrate to the substrate transfer mechanism, and receives a treated substrate from the substrate transfer mechanism to carry the treated substrate into the carrier.

Further, the second substrate transport robot may be a main transport robot which receives the untreated substrate from the substrate transfer mechanism to load the untreated substrate into a treatment unit, and unloads a treated substrate from the treatment unit to transfer the treated substrate to the substrate transfer mechanism.

The first and second substrate transport robots preferably each include an advancement/retraction driving mechanism which advances and retracts the upper and lower hands thereof with respect to the access position of the substrate transfer mechanism. The advancement/retraction driving mechanism is preferably capable of advancing and retracting the upper hand and the lower hand independently from each other.

According to one embodiment of the present invention, the substrate transport apparatus further comprises transport controlling means which, when the first substrate transport robot holds no substrate on the upper hand thereof and holds a substrate on the lower hand thereof and the substrate transfer mechanism holds a substrate on the upper hand thereof and holds no substrate on the lower hand thereof, keeps the upper and lower hands of the substrate transfer mechanism in the opened state, advances the upper and lower hands of the first substrate transport robot between the upper and lower hands of the substrate transfer mechanism and, in this state, causes the substrate transfer mechanism to perform the hand closing operation to transfer the substrate on the lower hand of the first substrate transport robot to the lower hand of the substrate transfer mechanism and, at the same time, transfer the substrate on the upper hand of the substrate transfer mechanism to the upper hand of the first substrate transport robot.

With this arrangement, the substrates can be instantaneously exchanged between the substrate transfer mechanism and the first substrate transport robot by advancing the upper and lower hands of the first substrate transport robot between the upper and lower hands of the substrate transfer mechanism and causing the substrate transfer mechanism to perform the hand closing operation. Of course, there is no need to vertically move the upper and lower hands of the first substrate transport robot.

The substrate transport apparatus preferably further comprises transport controlling means which, when the second substrate transport robot holds a substrate on the upper hand thereof and holds no substrate on the lower hand thereof and the substrate transfer mechanism holds no substrate on the upper hand thereof and holds a substrate on the lower hand thereof, keeps the upper and lower hands of the substrate transfer mechanism in the closed state, advances the upper and lower hands of the substrate transfer mechanism between the upper and lower hands of the second substrate transport robot and, in this state, causes the substrate transfer mechanism to perform the hand opening operation to transfer the substrate on the upper hand of the second substrate transport robot to the upper hand of the substrate transfer mechanism and, at the same time, transfer the substrate on the lower hand of the substrate transfer mechanism to the lower hand of the second substrate transport robot.

With this arrangement, the substrates can be instantaneously exchanged between the substrate transfer mechanism and the second substrate transport robot by advancing the upper and lower hands of the substrate transfer mechanism between the upper and lower hands of the second substrate transport robot and causing the substrate transfer mechanism to perform the hand opening operation. Of course, there is no need to vertically move the upper and lower hands of the second substrate transport robot.

The substrate transport apparatus preferably further comprises a movement mechanism which moves the substrate transfer mechanism between a first access position which is accessed by the first substrate transport robot and a second access position which is accessed by the second substrate transport robot.

With this arrangement, the substrate transfer mechanism serves as an auxiliary transport mechanism which transports the substrates between the first and second access positions. Thus, the stroke distances of the upper and lower hands of the first substrate transport robot for accessing the first access position and the stroke distances of the upper and lower hands of the second substrate transport robot for accessing the second access position are reduced. Therefore, the first and second substrate transport robots are constrained for a further shorter period for the transfer of the substrates, contributing to the reduction of the substrate transport time.

The upper and lower hands of the substrate transfer mechanism may be disposed in horizontally offset relation. With this arrangement, the vertical gap between the upper and lower hands of the substrate transfer mechanism disposed in horizontally offset relation can be reduced. Thus, the upper and lower hands of the substrate transfer mechanism can be inserted into a very small gap between the upper and lower hands of the first or second substrate transport robot.

Where substrate detection mechanisms are provided for detecting the substrates on the hands by utilizing light beams or the like, for example, the detection of the substrates can be assuredly achieved by disposing the upper and lower hands of the substrate transfer mechanism in horizontally offset relation.

Where the first and second substrate transport robots each include the advancement/retraction driving mechanism for advancing and retracting the upper and lower hands thereof independently from each other, the upper and lower hands of the substrate transfer mechanism are preferably offset horizontally from each other in directions of the advancement and retraction of the upper and lower hands of the first and second substrate transport robots. Thus, the transfer of the substrates between the substrate transfer mechanism and the first and second substrate transport robots can be achieved by controlling the advancement strokes of the upper and lower hands of the first and second substrate transport robots according to the positions of the upper and lower hands of the substrate transfer mechanism.

The inventive substrate transport method comprises the steps of: causing a first substrate transport robot having an upper hand and a lower hand vertically arranged to hold a substrate on the lower hand thereof and hold no substrate on the upper hand thereof; causing a substrate transfer mechanism having an upper hand and a lower hand vertically arranged to hold a substrate on the upper hand thereof and hold no substrate on the lower hand thereof; advancing the upper and lower hands of the first substrate transport robot between the upper and lower hands of the substrate transfer mechanism; with the upper and lower hands of the first substrate transport robot being located between the upper and lower hands of the substrate transfer mechanism, performing a first substrate transfer operation by narrowing a vertical gap between the upper and lower hands of the substrate transfer mechanism to transfer the substrate on the lower hand of the first substrate transport robot to the lower hand of the substrate transfer mechanism and, at the same time, transfer the substrate on the upper hand of the substrate transfer mechanism to the upper hand of the first substrate transport robot; causing a second substrate transport robot having an upper hand and a lower hand vertically arranged to hold a substrate on the upper hand thereof and hold no substrate on the lower hand thereof; advancing the upper and lower hands of the substrate transfer mechanism having experienced the first substrate transfer step between the upper and lower hands of the second substrate transport robot; and, with the upper and lower hands of the substrate transfer mechanism being located between the upper and lower hands of the second substrate transport robot, performing a second substrate transfer operation by widening the vertical gap between the upper and lower hands of the substrate transfer mechanism to transfer the substrate on the upper hand of the second substrate transport robot to the upper hand of the substrate transfer mechanism and, at the same time, transfer the substrate on the lower hand of the substrate transfer mechanism to the lower hand of the second substrate transport robot. The inventive substrate transport method may be modified in the same manner as the inventive substrate transport apparatus.

The foregoing and other objects, features and advantages of the present invention will become more apparent from the following detailed description of preferred embodiments with reference to the attached drawings.

DETAILED DESCRIPTION OF PREFERRED EMBODIMENTS

Figure 1:
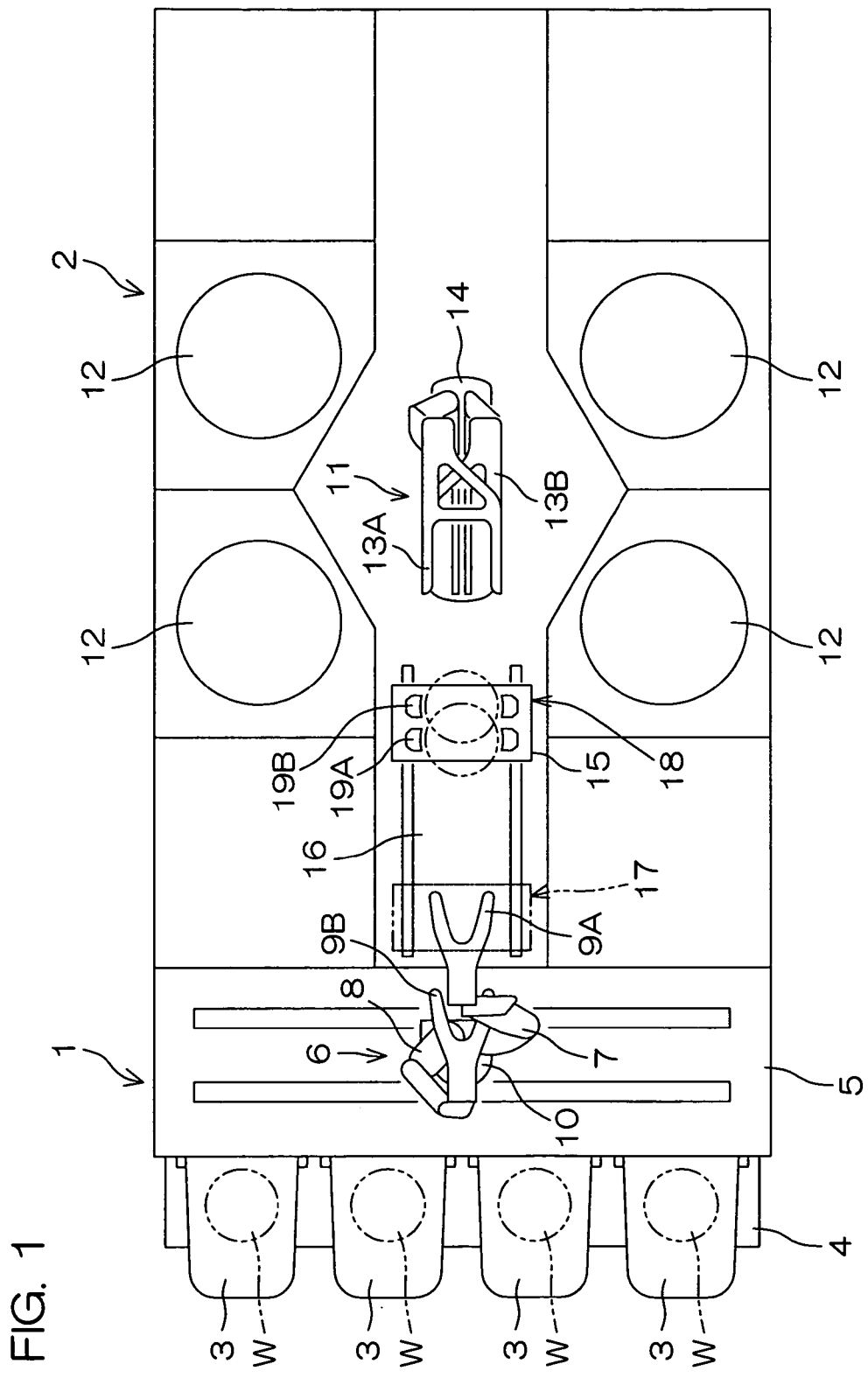
FIG. 1 is a schematic plan view for explaining the layout of a substrate treatment apparatus according to one embodiment of the present invention.

FIG. 1 is a schematic plan view for explaining the layout of a substrate treatment apparatus according to one embodiment of the present invention. The substrate treatment apparatus includes an indexer section 1 and a treatment section 2 connected to the indexer section 1. The indexer section 1 includes a carrier retaining portion 4 on which carriers 3 each capable of accommodating a plurality of substrates W (e.g., semiconductor wafers) in a stacked state are arranged along a predetermined direction, and an indexer robot 6 defined as the first substrate transport robot which is movable in a transport path 5 provided alongside the carrier retaining portion 4. The indexer robot 6 is a robot of a double arm type which includes a pair of arms 7, 8 to be driven independently from each other and an upper hand 9A and a lower hand 9B disposed in vertically offset relation and respectively connected to distal ends of the arms 7, 8. The indexer robot 6 includes an advancement/retraction driving mechanism 10 which drives the arms 7, 8 to advance and retract the upper hand 9A and the lower hand 9B independently from each other. Though not shown, the indexer robot 6 further includes an arm rotation driving mechanism which pivots the arms 7, 8 about vertical axes, a lift driving mechanism which moves up and down the arms 7, 8, and a reciprocal movement mechanism for moving the indexer robot 6 reciprocally in the transport path 5.

On the other hand, the treatment section 2 includes a main transport robot 11 defined as the second substrate transport robot disposed in the center of the treatment section 2, four treatment units 12 disposed around the main transport robot 11, and a shuttle transport mechanism 15 defined as the substrate transfer mechanism which transfers a substrate W between the indexer robot 6 and the main transport robot 11. The main transport robot 11 includes an upper hand 13A and a lower hand 13B disposed in vertically overlapped relation, and an advancement/retraction driving mechanism 14 for horizontally advancing and retracting the upper hand 13A and the lower hand 13B independently from each other. Though not shown, the main transport robot 11 further includes a rotation driving mechanism which pivots the upper hand 13A and the lower hand 13B about vertical axes, and a lift driving mechanism for moving up and down the upper hand 13A and the lower hand 13B. The main transport robot 11 is fixed to the treatment section 2 at its base and, therefore, cannot travel straight in the treatment section 2. The indexer robot 6, the main transport robot 11 and the shuttle transport mechanism 15 constitute the inventive substrate transport apparatus.

The shuttle transport mechanism 15 is movable along a transport path 16 extending from a generally middle portion of the transport path 5 of the indexer section 1 perpendicularly to the transport path 5 so as to be reciprocated between an indexer robot access position 17 and a main transport robot access position 18. The shuttle transport mechanism 15 includes an upper hand 19A and a lower hand 19B disposed in vertically offset relation, and is capable of vertically move the upper hand 19A and the lower hand 19B independently from each other.

Figure 2:
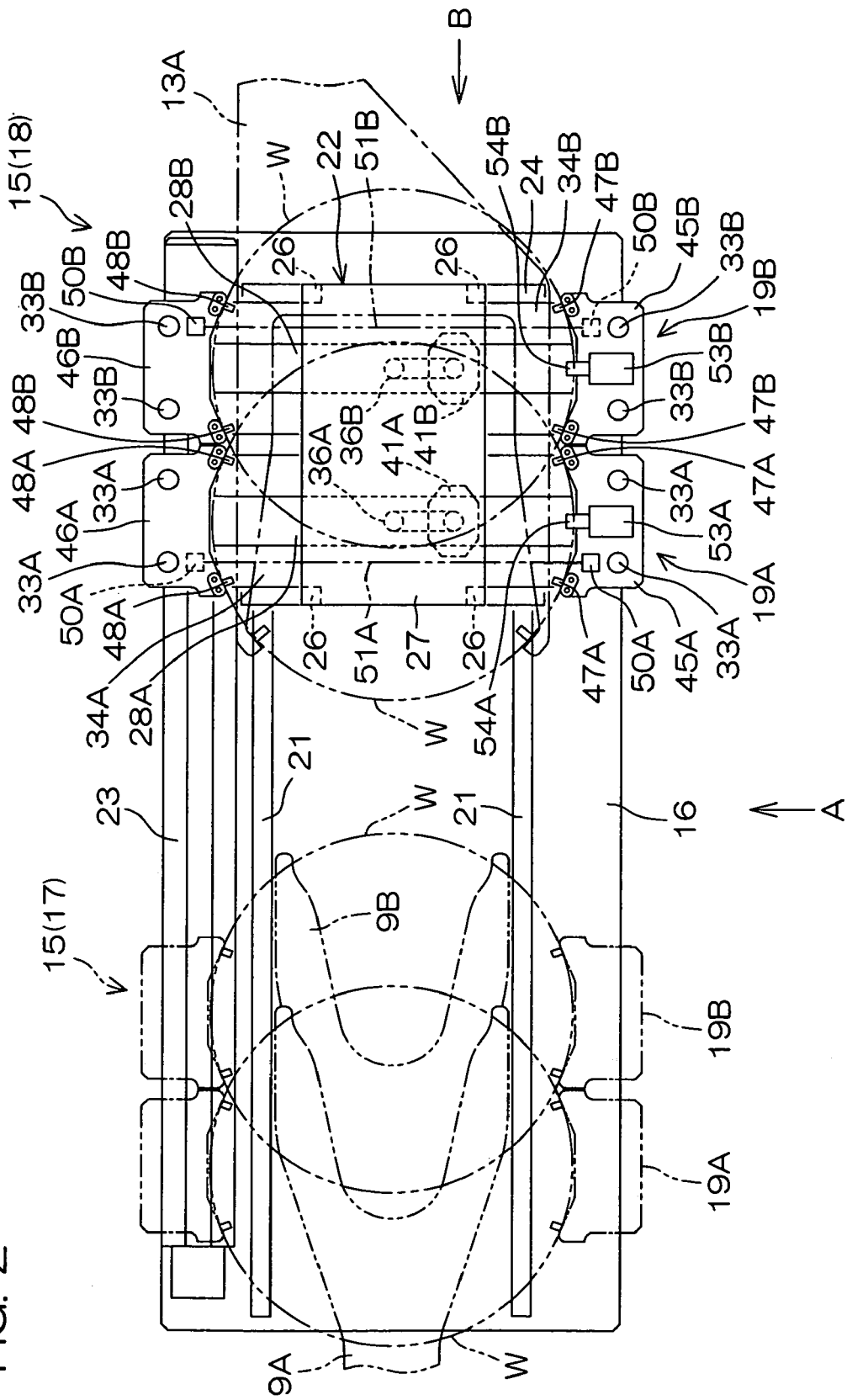
FIG. 2 is a plan view of a shuttle transport mechanism provided in the substrate treatment apparatus.
Figure 3:
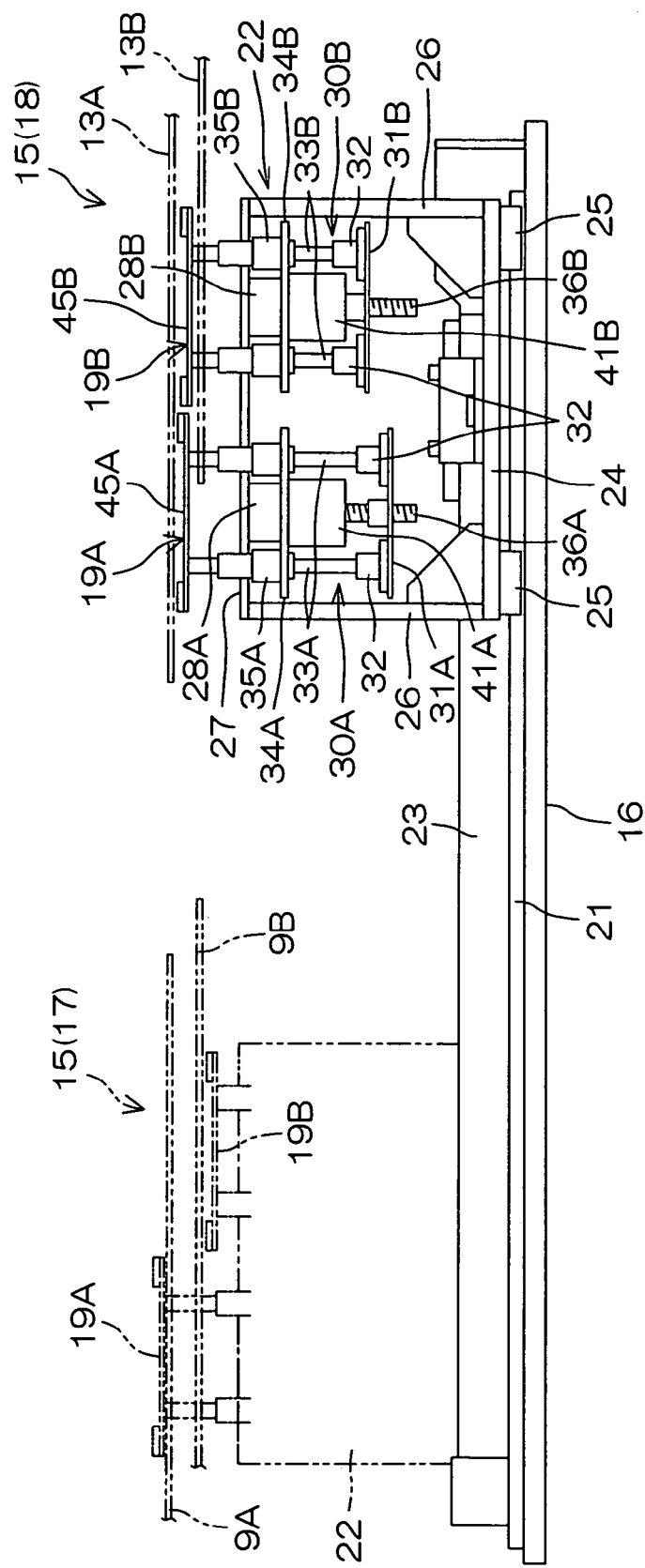
FIG. 3 is a front view of the shuttle transport mechanism as seen in an arrow direction A in FIG. 2.
Figure 4:
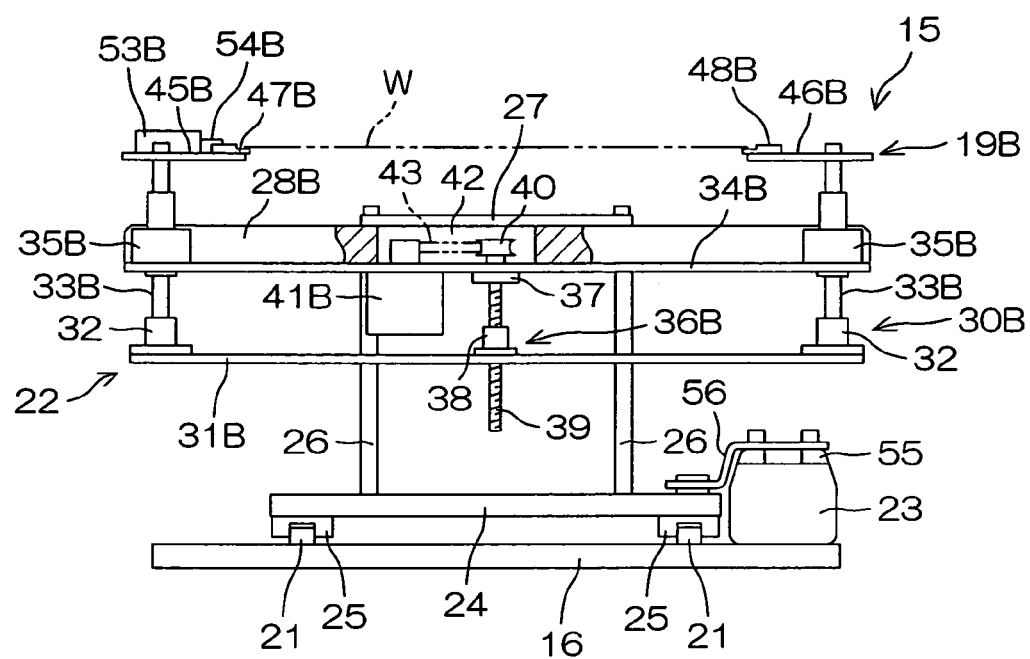
FIG. 4 is a side view of the shuttle transport mechanism as seen in an arrow direction B in FIG. 2.

FIG. 2 is a plan view of the shuttle transport mechanism 15. FIG. 3 is a front view of the shuttle transport mechanism 15 as seen in an arrow direction A in FIG. 2, and FIG. 4 is a side view of the shuttle transport mechanism 15 as seen in an arrow direction B in FIG. 2.

The shuttle transport mechanism 15 includes a pair of rails 21 disposed along the transport path 16, a main body 22 reciprocally movable on the rails 21, and a straight movement mechanism 23 for reciprocally moving the main body 22 along the rails 21. The main body 22 includes a seat plate 24 disposed horizontally, slide blocks 25 fixed to a bottom surface of the seat plate 24 and slidable on the rails 21, four support columns 26 projecting upright from the seat plate 24, a support plate 27 horizontally fixed to upper ends of the support columns 26, a pair of support beams 28A, 28B fixed to a lower surface of the support plate 27 and offset from each other along the transport path 16, and an upper hand driving mechanism 30A and a lower hand driving mechanism 30B respectively fixed to the support beams 28A, 28B.

The upper hand driving mechanism 30A and the lower hand driving mechanism 30B each include a generally rectangular lift plate 31A, 31B vertically movable below the support beam 28A, 28B, four guide shafts 33A, 33B fixed to four corners of the lift plate 31A, 31B as projecting upright, a generally rectangular fixing plate 34A, 34B fixed to a lower surface of the support beam 28A, 28B, guides 35A, 35B provided on four corners of the fixing plate 34A, 34B for guiding the four guide shafts 33A, 33B for vertical movement of the guide shafts 33A, 33B, and a ball screw mechanism 36A, 36B for vertically moving the lift plate 31A, 31B. The ball thread mechanism 36A, 36B includes a screw shaft 39, which is rotatably supported by a bearing 37 fixed to the fixing plate 34A, 34B and threadingly engaged with a ball nut 38 fixed to the lift plate 31A, 31B. A pulley 40 is fixed to an upper end of the screw shaft 39, and a torque from a motor 41A, 41B is applied to a belt 43 stretched around the pulley 40. The motor 41A, 41B is fixed to a lower surface of the fixing plate 34A, 34B, and its output shaft is housed in a through-hole 42 formed in the support beam 28A, 28B. The through-hole 42 is an elongated hole as seen in plan. The pulley 40 provided on the upper end of the screw shaft 39 and the belt 43 are also housed in the through-hole 42. An upper side of the through-hole 42 is covered with the support plate 27.

The hands 19A, 19B each include substrate support portions 45A, 46A; 45B, 46B horizontally fixed to upper ends of the two pairs of guide shafts 33A, 33B located on opposite sides of the ball screw mechanism 36A, 36B. The substrate support portions 45A, 46A; 45B, 46B are disposed at positions above opposite edges of the transport path 16 in opposed relation, and pairs of support claws 47A, 48A; 47B, 48B are fixed to inner portions of upper surfaces of the substrate support portions 45A, 46A; 45B, 46B for supporting peripheral edge portions of a substrate W from a lower side. The substrates W are respectively supported horizontally by the four support claws 47A, 48A of the upper hand 19A and by the four support claws 47B, 48B of the lower hand 19B.

The substrate support portions 45A, 46A of the upper hand 19A and the substrate support portions 45B, 46B of the lower hand 19B are offset longitudinally of the transport path 16, and adapted to be moved up and down independently from each other by driving the motors 41A, 41B.

In this embodiment, the upper hand 19A is constituted by the substrate support portions 45A, 46A disposed closer to the indexer section 1, while the lower hand 19B is constituted by the substrate support portions 45B, 46B disposed closer to the main transport robot 11. The upper hand 19A is provided with a transmissive substrate sensor 50A, which includes a light emitting element and a light receiving element provided on an upper surface of the substrate support portion 45A and a lower surface of the substrate support portion 46A. Similarly, the lower hand 19B is provided with a transmissive substrate sensor 50B, which includes a light emitting element and a light receiving element provided on a lower surface of the substrate support portion 45B and an upper surface of the substrate support portion 46B. The transmissive substrate sensor 50A detects a substrate W held by the upper hand 19A, and a detection line 51A defined by a light path between the light emitting element and the light receiving element is offset toward the indexer section 1 from a substrate W held by the lower hand 19B. Similarly, the transmissive substrate sensor 50B detects a substrate W held by the lower hand 19B, and a detection line 51B defined by a light path between the light emitting element and the light receiving element is offset toward the main transport robot 11 from a substrate W held by the upper hand 19A. The light emitting element and the light receiving element of each of the transmissive substrate sensors 50A, 50B are located at different heights, so that the detection lines 51A, 51B are inclined with respect to a horizontal plane. Thus, the substrates W can be assuredly detected.

The upper hand 19A and the lower hand 19B each include a cylinder 53A, 53B provided on an upper surface of one 45A, 45B of the substrate support portions 45A, 46A; 45B, 46B for holding the substrate W. The cylinder 53A, 53B is adapted to move a rod 54A, 54B toward the other substrate support portion 46A, 46B. Thus, the substrate W can be assuredly held between the rod 54A, 54B and the substrate support portion 46A, 46B by pressing the rod 54A, 54B toward the peripheral edge of the substrate W.

A driver 55 of the straight movement mechanism 23 is connected to the seat plate 24 of the main body 22 via a connection member 56. The straight movement mechanism 23 is a so-called electric cylinder which, for example, incorporates a ball screw mechanism and a motor for applying a driving force to the ball screw mechanism in a case thereof. The driver 55 is movable parallel to the rails 21. Thus, the main body 22 is reciprocally moved together with the upper hand 19A and the lower hand 19B retained thereon along the rails 21 in the transport path 16 by energizing the straight movement mechanism 23. A rodless cylinder or the like may be employed as the straight movement mechanism 23.

The upper hand 19A and the lower hand 19B of the shuttle transport mechanism 15 respectively transfer the substrates W with respect to the upper hand 9A and the lower hand 9B of the indexer robot 6. Further, the upper hand 19A and the lower hand 19B of the shuttle transport mechanism 15 respectively transfer the substrates W with respect to the upper hand 13A and the lower hand 13B of the main transport robot 11. Therefore, the upper and lower hands 9A, 9B of the indexer robot 6 are advanced to positions associated with the upper and lower hands 19A, 19B of the shuttle transport mechanism 15 when the shuttle transport mechanism 15 is located at the indexer robot access position 17 for the transfer of the substrates W. Similarly, the upper and lower hands 13A, 13B of the main transport robot 11 are advanced to positions associated with the upper and lower hands 19A, 19B of the shuttle transport mechanism 15 when the shuttle transport mechanism 15 is located at the main transport robot access position 18 for the transfer of the substrates W between the shuttle transport mechanism 15 and the main transport robot 11.

Figure 5:
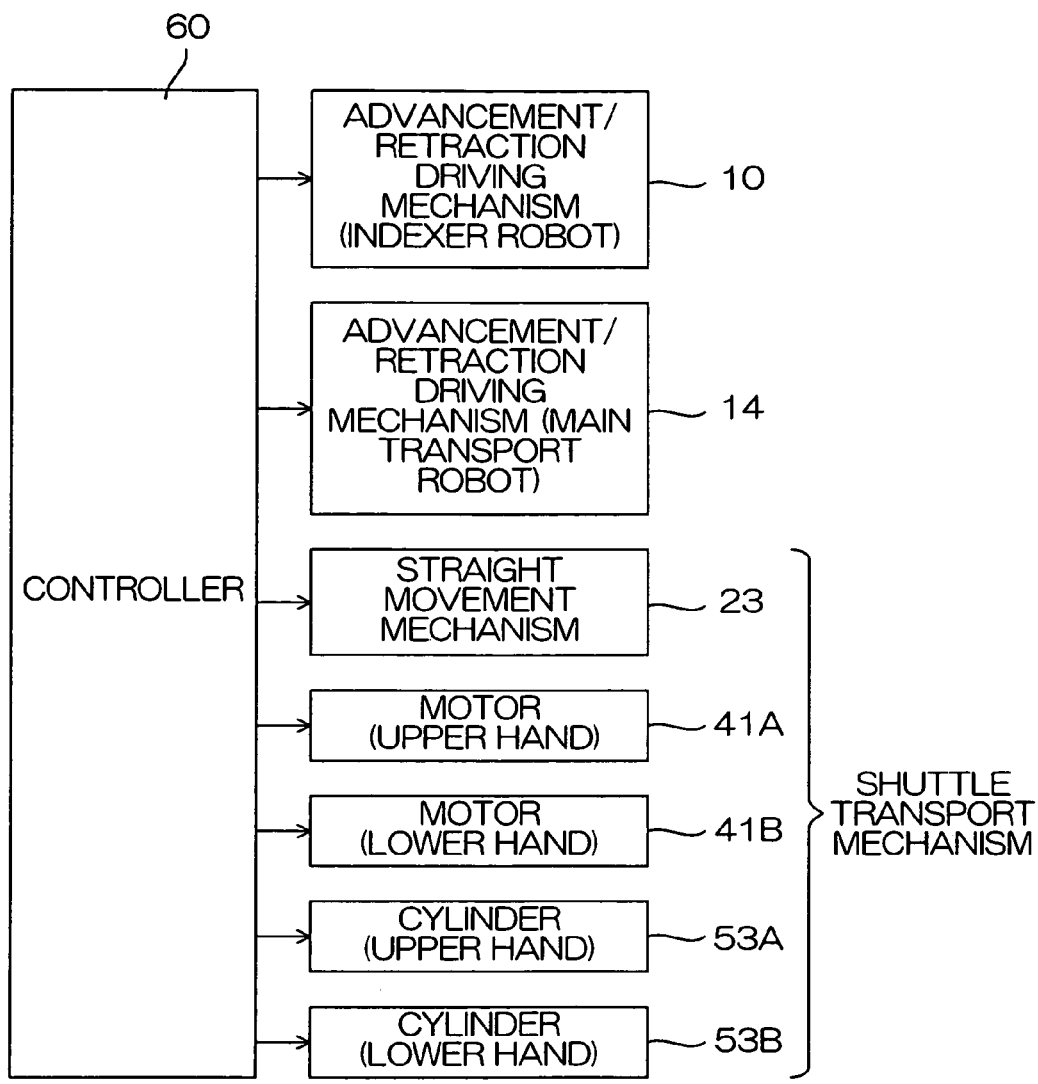
FIG. 5 is a block diagram illustrating an arrangement related to the control of the substrate treatment apparatus.

FIG. 5 is a block diagram illustrating an arrangement related to the control of the aforesaid substrate treatment apparatus. The substrate treatment apparatus includes a controller 60, which controls the advancement/retraction driving mechanism 10 of the indexer robot 6, the advancement/retraction driving mechanism 14 of the main transport robot 11, the straight movement mechanism 23, the motors 41A, 41B of the upper hand driving mechanism 30A and the lower hand driving mechanism 30B, and the cylinders 53A, 53B.

Figure 6:
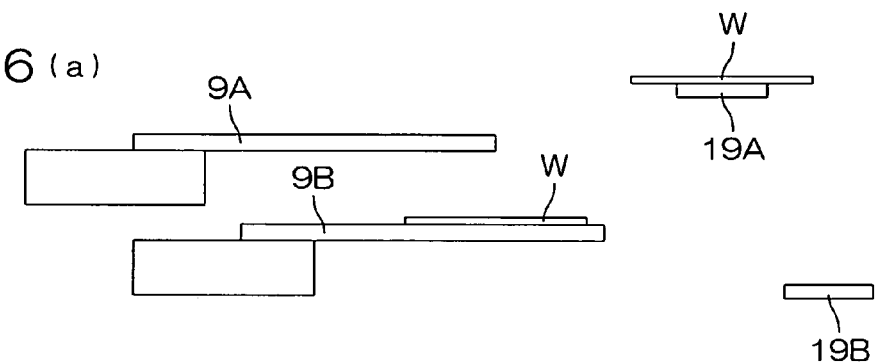
FIGS. 6(a), 6(b) and 6(c) are schematic diagrams for explaining a substrate transfer operation to be performed for transferring substrates between an indexer robot and the shuttle transport mechanism.
Figure 6:
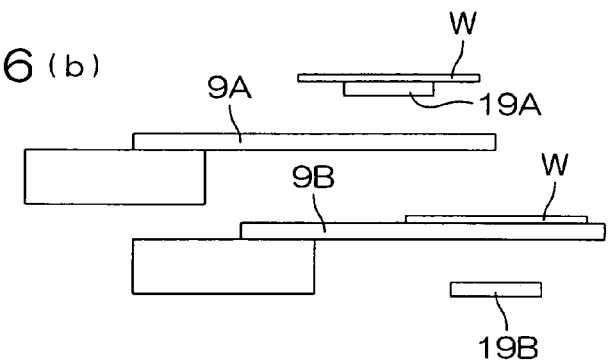
Figure 6:
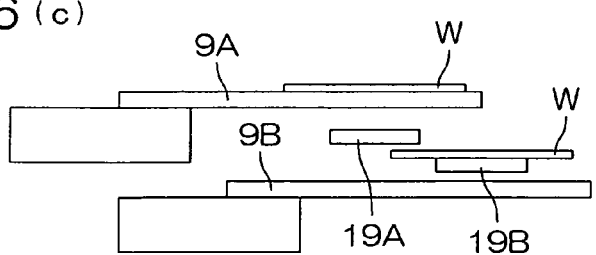

FIGS. 6(a), 6(b) and 6(c) are schematic diagrams for explaining a substrate transfer operation to be performed for transferring substrates between the indexer robot 6 and the shuttle transport mechanism 15. The indexer robot 6 takes out a single untreated substrate from one of the carriers 3 retained on the carrier retaining portion 4 by the lower hand 9B, and is moved along the transport path 5 to bring the upper hand 9A and the lower hand 9B thereof into opposed relation to the indexer robot access position 17. On the other hand, the shuttle transport mechanism 15 is moved to the indexer robot access position 17 with the upper hand 9A thereof holding a treated substrate W transferred from the main transport robot 11. At this time, the controller 60 controls the motors 41A, 41B to locate the upper hand 19A at an upper position and locate the lower hand 19B at a lower position. That is, the upper hand 19A and the lower hand 19B are in a hand opened state with a vertical gap therebetween widened. This state is shown in FIG. 6(a).

In this state, the upper and lower hands 9A, 9B of the indexer robot 6 are advanced between the upper hand 19A and the lower hand 19B of the shuttle transport mechanism 15 to be brought into a state shown in FIG. 6(b). The operation for advancing the upper and lower hands 9A, 9B of the indexer robot 6 between the upper and lower hands 19A, 19B of the shuttle transport mechanism 15 may be performed by first moving the shuttle transport mechanism 15 to the indexer robot access position 17 and then advancing the upper and lower hands 9A, 9B of the indexer robot 6 to the indexer robot access position 17. Alternatively, this operation may be performed by advancing the upper and lower hands 9A, 9B of the indexer robot 6 to the indexer robot access position 17 before the shuttle transport mechanism 15 reaches the indexer robot access position 17, and then moving the shuttle transport mechanism 15 to the indexer robot access position 17, whereby the upper and lower hands 9A, 9B of the indexer robot 6 are located between the upper hand 19A and the lower hand 19B of the shuttle transport mechanism 15.

In the state shown in FIG. 6(b), the controller 60 controls the motors 41A, 41B to move down the upper hand 19A and move up the lower hand 19B, whereby a hand closing operation is performed to narrow the vertical gap between the upper hand 19A and the lower hand 19B. The resulting state is shown in FIG. 6(c). That is, the untreated substrate W held by the lower hand 9B of the indexer robot 6 is taken up by the lower hand 19B of the shuttle transport mechanism 15 and, at the same time, the treated substrate W held by the upper hand 19A of the shuttle transport mechanism 15 is placed on the upper hand 9A of the indexer robot 6. Thus, the untreated substrate W and the treated substrate W are simultaneously exchanged between the shuttle transport mechanism 15 and the indexer robot 6.

In the shuttle transport mechanism 15, the substrate support portions 45A, 45B of the upper and lower hands 19A, 19B are opposed to the substrate support portions 46A, 46B of the upper and lower hands 19A, 19B in spaced relation sufficient to receive the upper and lower hands 9A, 9B of the indexer robot 6. Therefore, the hands 19A, 19B do not interfere with the hands 9A, 9B of the indexer robot 6 when moved vertically.

After the exchange of the substrates W, the advancement/retraction driving mechanism 10 of the indexer robot 6 is controlled by the controller. 60 to simultaneously retract the upper hand 9A and the lower hand 9B. Thereafter, the indexer robot 6 carries the treated substrate W received from the shuttle transport mechanism 15 into one of the carriers 3, and takes out another untreated substrate W from one of the carriers 3. On the other hand, the straight movement mechanism 23 of the shuttle transport mechanism 15 is controlled by the controller 60 to move the shuttle transport mechanism 15 along the transport path 16 to the main transport robot access position 18. At this time, the upper and lower hands 19A, 19B of the shuttle transport mechanism 15 are in a closed state with the vertical gap therebetween narrowed (see FIG. 6(c)).

Figure 7A:
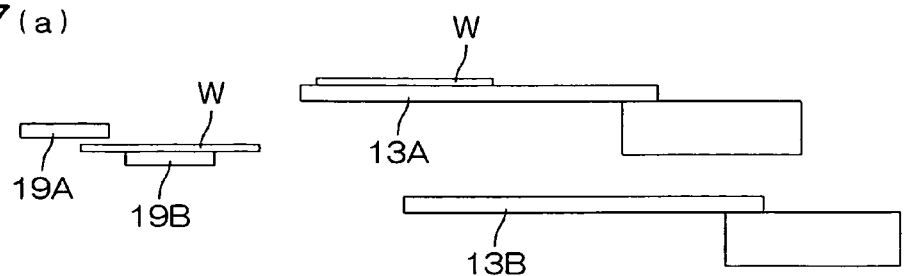
FIGS. 7(a), 7(b) and 7(c) are schematic diagrams for explaining a substrate transfer operation to be performed for transferring substrates between the shuttle transport mechanism and a main transport robot.
Figure 7B:
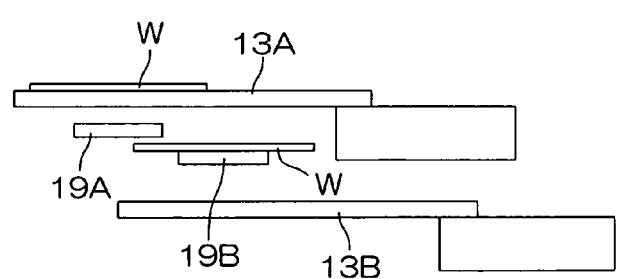
Figure 7C:
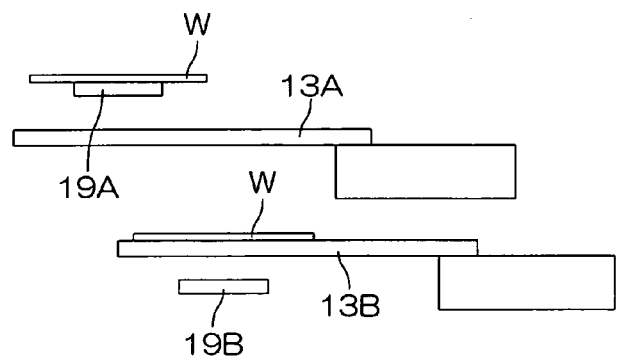

FIGS. 7(a), 7(b) and 7(c) are schematic diagrams for explaining a substrate transfer operation to be performed for transferring substrates W between the shuttle transport mechanism 15 and the main transport robot 11. The shuttle transport mechanism 15 is moved to the main transport robot access position 18 in a hand closed state with the vertical gap between the upper hand 19A and the lower hand 19B thereof narrowed. At this time, the untreated substrate W is held by the lower hand 19B, and no substrate is held by the upper hand 19A (see FIG. 7(a)).

On the other hand, the main transport robot 11 unloads a treated substrate W from one of the treatment units 12 by the upper hand 13A, and is moved to the main transport robot access position 18. At this time, the controller 60 controls the advancement/retraction driving mechanism 14 of the main transport robot 11 to simultaneously advance the upper and lower hands 13A, 13B of the main transport robot 11 to the main transport robot access position 18. Thus, the upper hand 19A and the lower hand 19B of the shuttle transport mechanism 15 in the hand closed state are inserted between the upper hand 13A and the lower hand 13B of the main transport robot 11 as shown in FIG. 7(b). If the upper and lower hands 13A, 13B of the main transport robot 11 are advanced to the main transport robot access position 18 before the shuttle transport mechanism 15 reaches the main transport robot access position 18, the upper and lower hands 19A, 19B of the shuttle transport mechanism 15 are advanced between the upper hand 13A and the lower hand 13B. On the other hand, if the shuttle transport mechanism 15 reaches the main transport robot access position 18 in advance, the upper and lower hands 13A, 13B of the main transport robot 11 are simultaneously advanced to the main transport robot access position 18, whereby the upper and lower hands 19A, 19B of the shuttle transport mechanism 15 in the hand closed state are held between the upper hand 13A and the lower hand 13B from upper and lower sides.

Next, the controller 60 controls the motors 41A, 41B of the shuttle transport mechanism 15 to perform a hand opening operation to widen the vertical gap between the upper hand 19A and the lower hand 19B. Thus, the treated substrate W held by the upper hand 13A of the main transport robot 11 is taken up by the upper hand 19A of the shuttle transport mechanism 15. At the same time, the untreated substrate W held by the lower hand 19B of the shuttle transport mechanism 15 is placed on the lower hand 13B of the main transport robot 11. Thus, the untreated substrate W and the treated substrate W are simultaneously exchanged between the main transport robot 11 and the shuttle transport mechanism 15 (see FIG. 7(c)).

In the shuttle transport mechanism 15, the substrate support portions 45A, 45B of the upper and lower hands 19A, 19B are opposed to the substrate support portions 46A, 46B of the upper and lower hands 19A, 19B in spaced relation sufficient to receive the upper and lower hands 13A, 13B of the main transport robot 11. Therefore, the hands 19A, 19B do not interfere with the hands 13A, 13B of the main transport robot 11 when moved vertically.

Thereafter, the shuttle transport mechanism 15 is moved to the indexer robot access position 17 in the hand opened state with the vertical gap between the upper hand 19A and the lower hand 19B widened. On the other hand, the main transport robot 11 simultaneously retracts the upper and lower hands 13A, 13B, and loads the untreated substrate W held by the lower hand 13B into one of the treatment units 12. When a treated substrate W is present in the treatment unit 12, the treated substrate W is unloaded by the upper hand 13A prior to the loading of the untreated substrate W.

The controller 60 controls the cylinders 53A, 53B to extend the rods 54A, 54B when the shuttle transport mechanism 15 is moved along the transport path 16 by controlling the straight movement mechanism 23. Thus, the shuttle transport mechanism 15 is moved between the indexer robot access position 17 and the main transport robot access position 18, while assuredly holding the substrates W.

According to the embodiment described above, the untreated substrate W and the treated substrate W are simultaneously exchanged between the upper and lower hands 9A, 9B of the indexer robot 6 and the upper and lower hands 19A, 19B of the shuttle transport mechanism 15 (by one action). Further, the untreated substrate W and the treated substrate W are simultaneously exchanged between the upper and lower hands 19A, 19B of the shuttle transport mechanism 15 and the upper and lower hands 13A, 13B of the main transport robot 11 (by one action). In addition, there is no need to vertically move the upper and lower hands 9A, 9B of the indexer robot 6 and the upper and lower hands 13A, 13B of the main transport robot 11 during these substrate exchanging operations. Therefore, the indexer robot 6 is merely required to simultaneously advance the upper and lower hands 9A, 9B thereof to the indexer robot access position 17, and the main transport robot 11 is merely required to simultaneously advance the upper and lower hands 13A, 13B thereof to the main transport robot access position 18. Thus, the transfer of the substrates W between the indexer robot 6 and the shuttle transport mechanism 15 is completed in a very short time, and the transfer of the substrates W between the shuttle transport mechanism 15 and the main transport robot 11 is completed in a very short time.

Since the indexer robot 6 and the main transport robot 11 are constrained for a very short period for the transfer of the substrates W with respect to the shuttle transport mechanism 15, the total time required for the substrate treatment is reduced. Further, the transfer of the substrates W between the indexer robot 6 and the main transport robot 11 is achieved via the shuttle transport mechanism 15, whereby the indexer robot 6 and the main transport robot 11 can respectively perform the substrate transport operations without mutually constraining the substrate transport operations. Since the substrates W can be thus transported efficiently, the substrate transport time can be further reduced.

Further, the shuttle transport mechanism 15 serves for auxiliary substrate transportation between the indexer robot access position 17 and the main transport robot access position 18, so that the stroke distances of the upper and lower hands 9A, 9B between the indexer robot 6 and the indexer robot access position 17 and the stroke distances of the upper and lower hands 13A, 13B between the main transport robot 11 and the main transport robot access position 18 are reduced. Thus, the indexer robot 6 and the main transport robot 11 are constrained for a shorter period for the substrate transfer, so that the time required for the transportation of the substrates W is reduced to improve the substrate treatment productivity.

In the aforesaid embodiment, the upper and lower hands 19A, 19B of the shuttle transport mechanism 15 are offset along a line extending from the indexer robot access position 17 to the main transport robot access position 18 (along the transport path 16). Thus, the vertical distance between the upper hand 19A and the lower hand 19B (more precisely, a difference between the substrate holding heights of the respective hands 19A, 19B) can be minimized without interference between the support claws 47A, 48A and the support claws 47B, 48B. As a result, the upper and lower hands 19A, 19B of the shuttle transport mechanism 15 in the hand closed state can be advanced between the upper and lower hands 13A, 13B of the main transport robot 11. In addition, the detection lines 51A, 51B of the transmissive substrate sensors 50A, 50B are each defined in a position free from interference with the substrate W held by the other hand 19B, 19A as described above. Thus, the substrates W respectively held by the upper hand 19A and the lower hand 19B can be assuredly detected.

The upper and lower hands 19A, 19B of the shuttle transport mechanism 15 are horizontally offset along the transport path 16 and, hence, parallel to the movement directions of the hands 9A, 9B of the indexer robot 6 and parallel to the movement directions of the hands 13A, 13B of the main transport robot 11. Therefore, the substrate transfer between the hands 19A, 19B of the shuttle transport mechanism 15 and the hands 9A, 9B of the indexer robot 6 and between the hands 19A, 19B of the shuttle transport mechanism 15 and the hands 13A, 13B of the main transport robot 11 can be achieved by permitting the upper and lower hands 9A, 9B of the indexer robot 6 to advance different distances and permitting the upper and lower hands 13A, 13B of the main transport robot 11 to advance different distances.

Figure 8:
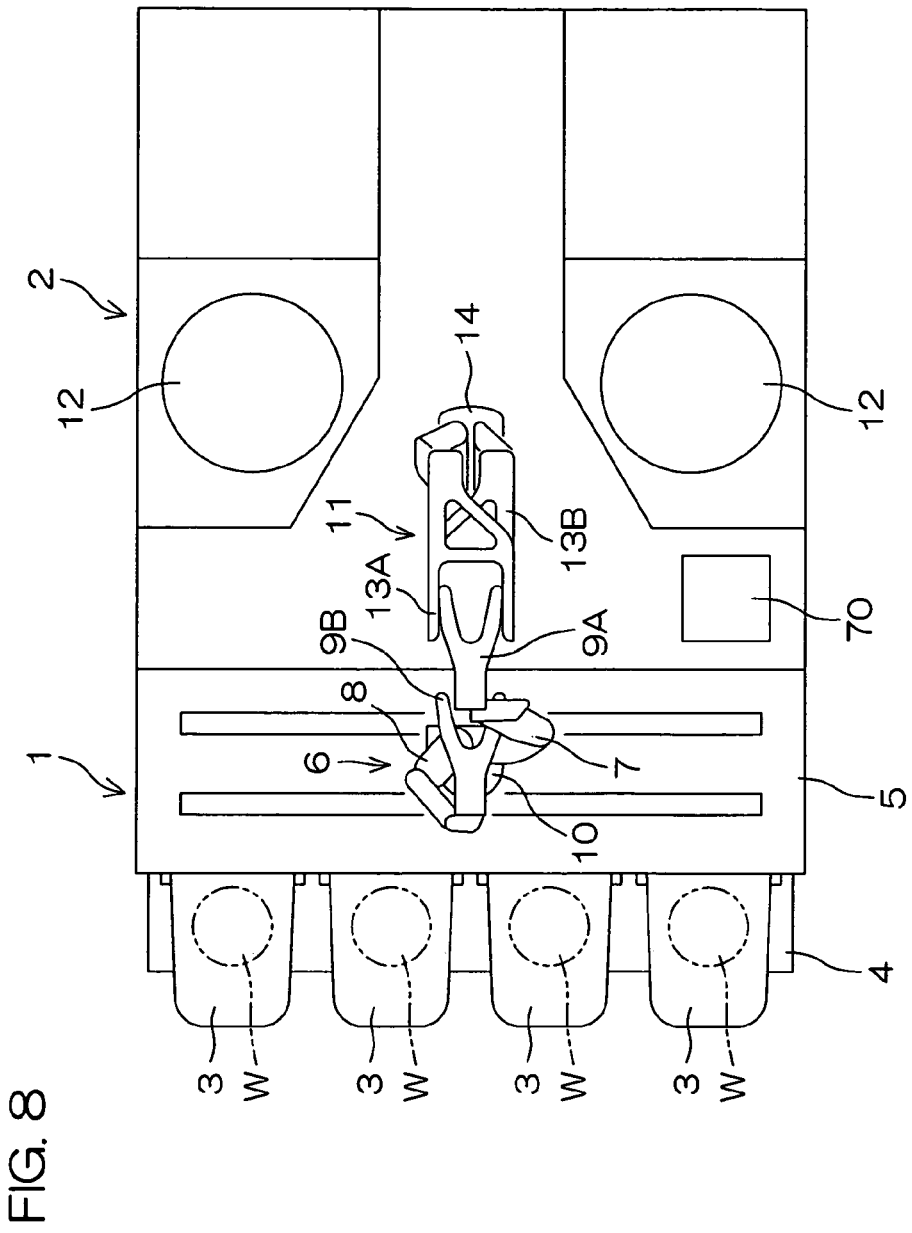
FIG. 8 is a schematic plan view for explaining the layout of a substrate treatment apparatus according to another embodiment of the present invention.

FIG. 8 is a schematic plan view for explaining the layout of a substrate treatment apparatus according to another embodiment of the present invention. In FIG. 8, components corresponding to those shown in FIG. 1 will be denoted by the same reference characters as in FIG. 1. In this substrate treatment apparatus, the treatment section 2 includes a pair of treatment units 12, and the main transport robot 11 is disposed between the treatment units 12 and the indexer section 1. In the treatment section 2, a substrate transfer mechanism 70 is disposed in a position adjacent to one end of the transport path 5 of the indexer section 1 so as to be accessed by both the indexer robot 6 and the main transport robot 11. The substrate transfer mechanism 70 has substantially the same construction as the aforesaid shuttle transport mechanism 15, except that the arrangement for the straight movement is not provided and the upper and lower hands are not horizontally offset from each other. This embodiment provides the same effects as the first embodiment. In this embodiment, the indexer robot 6, the main transport robot 11 and the substrate transfer mechanism 70 constitute the inventive substrate transport apparatus.

With the arrangement according to this embodiment, it is also possible to transfer a substrate W directly between the indexer robot 6 and the main transport robot 11. Therefore, the direct substrate transfer and the indirect substrate transfer via the substrate transfer mechanism 70 may be selectively carried out. For example, a transport period for the direct substrate transfer and a transport period for the indirect substrate transfer may be estimated according to the operation states of the indexer robot 6 and the main transport robot 11, and the indexer robot 6, the main transport robot 11 and the substrate transfer mechanism 70 may be controlled to carry out one of the direct substrate transfer and the indirect substrate transfer requiring a shorter transport period.

While the two embodiments of the present invention have thus been described, the invention may be embodies in any other ways. In the embodiments described above, the upper and lower hands 19A, 19B of the shuttle transport mechanism 15 are horizontally offset, but the horizontal offset is not required if there is no need to narrow the vertical gap between the upper hand 19A and the lower hand 19B.

The detection of the substrates W held by the upper and lower hands 19A, 19B may be achieved by detecting the operation states of the rods 54A, 54B of the cylinders 53A, 53B rather than with the use of the transmissive substrate sensors 50A, 50B.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2005-092505 filed with the Japanese Patent Office on Mar. 28, 2005, the disclosure of which is incorporated herein by reference.

What is claimed is:

1. A substrate transport apparatus, comprising:
    a first substrate transport robot including an upper hand and a lower hand vertically arranged and capable of transporting substrates respectively held by the upper hand and the lower hand thereof;
    a second substrate transport robot including an upper hand and a lower hand vertically arranged and capable of transporting substrates respectively held by the upper hand and the lower hand thereof; and
    a substrate transfer mechanism which is accessed by the first substrate transport robot and the second substrate transport robot to transfer the substrates with respect to the first substrate transport robot and the second substrate transport robot, the substrate transfer mechanism including an upper hand and a lower hand vertically arranged and a hand driving mechanism adapted to perform a hand opening operation to vertically move the upper hand and the lower hand of the substrate transfer mechanism apart from each other and perform a hand closing operation to vertically move the upper hand and the lower hand of the substrate transfer mechanism toward each other.

2. A substrate transport apparatus as set forth in claim 1, further comprising transport controlling means which, when the first substrate transport robot holds no substrate on the upper hand thereof and holds a substrate on the lower hand thereof and the substrate transfer mechanism holds a substrate on the upper hand thereof and holds no substrate on the lower hand thereof, keeps the upper and lower hands of the substrate transfer mechanism in an opened state, advances the upper and lower hands of the first substrate transport robot between the upper and lower hands of the substrate transfer mechanism and, in this state, causes the substrate transfer mechanism to perform the hand closing operation to transfer the substrate on the lower hand of the first substrate transport robot to the lower hand of the substrate transfer mechanism and, at the same time, transfer the substrate on the upper hand of the substrate transfer mechanism to the upper hand of the first substrate transport robot.

3. A substrate transport apparatus as set forth in claim 1, further comprising transport controlling means which, when the second substrate transport robot holds a substrate on the upper hand thereof and holds no substrate on the lower hand thereof and the substrate transfer mechanism holds no substrate on the upper hand thereof and holds a substrate on the lower hand thereof, keeps the upper and lower hands of the substrate transfer mechanism in a closed state, advances the upper and lower hands of the substrate transfer mechanism between the upper and lower hands of the second substrate transport robot and, in this state, causes the substrate transfer mechanism to perform the hand opening operation to transfer the substrate on the upper hand of the second substrate transport robot to the upper hand of the substrate transfer mechanism and, at the same time, transfer the substrate on the lower hand of the substrate transfer mechanism to the lower hand of the second substrate transport robot.

4. A substrate transport apparatus as set forth in claim 1, further comprising a movement mechanism which moves the substrate transfer mechanism between a first access position which is accessed by the first substrate transport robot and a second access position which is accessed by the second substrate transport robot.

5. A substrate transport apparatus as set forth in claim 1, wherein
    the upper and lower hands of the substrate transfer mechanism are disposed in horizontally offset relation.

6. A substrate transport method comprising the steps of:
    causing a first substrate transport robot having an upper hand and a lower hand vertically arranged to hold a substrate on the lower hand thereof and hold no substrate on the upper hand thereof;
    causing a substrate transfer mechanism having an upper hand and a lower hand vertically arranged to hold a substrate on the upper hand thereof and hold no substrate on the lower hand thereof;
    advancing the upper and lower hands of the first substrate transport robot between the upper and lower hands of the substrate transfer mechanism;
    with the upper and lower hands of the first substrate transport robot being located between the upper and lower hands of the substrate transfer mechanism, performing a first substrate transfer operation by narrowing a vertical gap between the upper and lower hands of the substrate transfer mechanism to transfer the substrate on the lower hand of the first substrate transport robot to the lower hand of the substrate transfer mechanism and, at the same time, transfer the substrate on the upper hand of the substrate transfer mechanism to the upper hand of the first substrate transport robot;
    causing a second substrate transport robot having an upper hand and a lower hand vertically arranged to hold a substrate on the upper hand thereof and hold no substrate on the lower hand thereof;
    advancing the upper and lower hands of the substrate transfer mechanism having experienced the first substrate transfer step between the upper and lower hands of the second substrate transport robot; and with the upper and lower hands of the substrate transfer mechanism being located between the upper and lower hands of the second substrate transport robot, performing a second substrate transfer operation by widening the vertical gap between the upper and lower hands of the substrate transfer mechanism to transfer the substrate on the upper hand of the second substrate transport robot to the upper hand of the substrate transfer mechanism and, at the same time, transfer the substrate on the lower hand of the substrate transfer mechanism to the lower hand of the second substrate transport robot.

* * * * *